US012805080B2

(12) United States Patent
Hao et al.

(10) Patent No.: US 12,805,080 B2
(45) Date of Patent: Nov. 17, 2026

(54) METASURFACE FOR IMPROVING A LIGHT EXTRACTION EFFICIENCY OF A LIGHT-EMITTING DIODE

(71) Applicant: SHENZHEN METALENX TECHNOLOGY CO., LTD, Shenzhen (CN)

(72) Inventors: Chenglong Hao, Shenzhen (CN); Fengze Tan, Shenzhen (CN); Jian Zhu, Shenzhen (CN)

(73) Assignee: SHENZHEN METALENX TECHNOLOGY CO., LTD, Shenzhen (CN)

( * ) Notice: Subject to any disclaimer, the term of this patent is extended or adjusted under 35 U.S.C. 154(b) by 387 days.

(21) Appl. No.: 18/432,070

(22) Filed: Feb. 5, 2024

(65) Prior Publication Data

US 2024/0178354 A1 May 30, 2024

Related U.S. Application Data

(63) Continuation of application No. PCT/CN2022/097831, filed on Jun. 9, 2022.

(30) Foreign Application Priority Data

Sep. 23, 2021 (CN) .......................... 202111115801.9

(51) Int. Cl.
*H10H 20/855* (2025.01)
*H10H 20/821* (2025.01)
*H10W 90/00* (2026.01)

(52) U.S. Cl.
CPC ........ *H10H 20/855* (2025.01); *H10H 20/821* (2025.01); *H10W 90/00* (2026.01)

(58) Field of Classification Search
CPC .. H10H 20/855; H10H 20/821; H10H 20/872; H10K 50/858; B82Y 20/00; H10W 90/00; Y02D 30/70
See application file for complete search history.

(56) References Cited

U.S. PATENT DOCUMENTS 10,996,451 B2 * 5/2021 Tamma .............. G02B 19/0028
11,181,775 B2 * 11/2021 You ...................... G02B 5/1809
(Continued)

FOREIGN PATENT DOCUMENTS

CN 1573365 2/2005
CN 105027671 11/2015
(Continued)

OTHER PUBLICATIONS

"International Search Report (Form PCT/ISA/210) of PCT/CN2022/097831", mailed on Jul. 15, 2022, with English translation thereof, pp. 1-4.

*Primary Examiner* — Mamadou L Diallo
(74) *Attorney, Agent, or Firm* — JCIPRNET

(57) ABSTRACT

Provided is a metasurface for improving a light extraction efficiency of a light-emitting diode, including a substrate and unit cells. The substrate being transmissive to optical radiation is on a metal oxide layer of the light-emitting diode. The unit cells are on a side of the substrate away from the metal oxide layer and formed in densely-packed patterns. A center and/or a vertex of each densely-packed pattern are respectively provided with a nanostructure. Nanostructures are divided into four quadrants by a first axis and a second axis. A projection of a cross-sectional quadrant pattern in any quadrant onto the first axis is the same as that onto the second axis. The cross-sectional quadrant pattern in any quadrant is mirrored along the two axes to form a cross-sectional pattern of the nanostructures. The first axis, the
(Continued)

second axis and a height direction of the nanostructures are perpendicular to each other.

19 Claims, 13 Drawing Sheets

(56) References Cited

U.S. PATENT DOCUMENTS

| | | | | |
|---|---|---|---|---|
| 11,762,212 | B2 * | 9/2023 | Downing | G02B 5/0278 356/4.01 |
| 2019/0064532 | A1 * | 2/2019 | Riley, Jr. | G02B 27/0916 |
| 2019/0113727 | A1 * | 4/2019 | Tamma | F21V 7/0008 |
| 2019/0189932 | A1 * | 6/2019 | Sekine | C09K 11/06 |
| 2021/0173137 | A1 * | 6/2021 | Meng | G02F 1/133368 |
| 2024/0151876 | A1 * | 5/2024 | Nelson | G02B 1/002 |
| 2024/0237461 | A1 * | 7/2024 | Wang | H10K 59/353 |
| 2024/0427055 | A1 * | 12/2024 | Rho | G02B 1/00 |

FOREIGN PATENT DOCUMENTS

| | | | | | |
|---|---|---|---|---|---|
| CN | 101859856 | | | 6/2016 | |
| CN | 110797442 | | | 2/2020 | |
| JP | 2005055481 | A | * | 3/2005 | G02F 1/335 |
| KR | 20150141955 | A | * | 12/2015 | H10H 20/855 |

* cited by examiner

METASURFACE FOR IMPROVING A LIGHT EXTRACTION EFFICIENCY OF A LIGHT-EMITTING DIODE

CROSS-REFERENCE TO RELATED APPLICATIONS

This application is a continuation of International Patent Application No. PCT/CN2022/097831, filed on Jun. 9, 2022, which claims the benefit of priority from Chinese Application No. 202111115801.9, filed on Sep. 23, 2021. The content of the aforementioned applications, including any intervening amendments thereto, are incorporated herein by reference.

BACKGROUND

Field of the Invention

The present disclosure relates to the field of light-emitting diodes, in particular to a metasurface for improving a light extraction efficiency of a light-emitting diode.

Description of Related Art

Light Emitting Diode (LED) and Organic Light Emitting Diode (OLED) are widely used in lighting and display fields.

Due to factors such as reflection and refraction occurred at a boundary between a glass substrate and air, most of photons generated by the existing LEDs and OLEDs cannot escape into the air, leading to a low photon utilization rate, which hinders the application and the development of LEDs and OLEDs.

In order to improve the light extraction efficiency of LEDs and OLEDs, solutions in the related art include roughening a substrate surface, embossing a glass surface or adopting a microlens array. However, in these existing solutions, fabrication processes are complicated and costly, thereby being inappropriate for mass production.

SUMMARY

In view of the above technical problems, a metasurface for improving a light extraction efficiency of a light-emitting diode is provided according to embodiments of the present disclosure, so as to overcome the problems in the related art. For example, in the existing solutions, the fabrication processes are complicated and costly.

In an embodiment, a metasurface for improving a light extraction efficiency of a light-emitting diode is provided. The metasurface includes a substrate and a plurality of unit cells; where, the substrate is provided on a metal oxide layer of the light-emitting diode, for example, being provided on an indium tin oxide layer; the substrate is transmissive to optical radiation, for example, being capable of transmitting visible light; the plurality of unit cells are provided on a side of the substrate away from the metal oxide layer; the plurality of unit cells are formed in densely-packed patterns; the metasurface includes a plurality of nanostructures, and each of the nanostructures is arranged at a center or a vertex of each densely-packed pattern, or each of the center and the vertex of each densely-packed pattern is provided with one of the nanostructures; transmittance of the unit cells is not equal to zero for the optical radiation with any incident angle greater than a critical angle; and the nanostructures are divided into four quadrants formed by intersecting a first axis and a second axis; a projection of a cross-sectional quadrant pattern of the nanostructures in any quadrant onto the first axis is the same as a projection of the cross-sectional quadrant pattern onto the second axis; the cross-sectional quadrant pattern in any quadrant is mirrored along the first axis and the second axis to form a cross-sectional pattern of the nanostructures; the first axis and the second axis are perpendicular to each other, and the first axis and the second axis are both perpendicular to a height direction of the nanostructures.

In an embodiment, the plurality of unit cells are arranged in an array.

In an embodiment, a period of any one of the plurality of unit cells is greater than or equal to 300 nm and less than or equal to 800 nm.

In an embodiment, periods of the unit cells in different positions of the metasurface are the same.

In an embodiment, periods of the unit cells in different positions of the metasurface are different.

In an embodiment, the plurality of unit cells include at least two types of unit cells in different shapes.

In an embodiment, any one of the unit cells has a regular hexagon shape and/or a square shape.

In an embodiment, a height of the nanostructures at least satisfies a formula as follows:

$$0.5\lambda_{min} \leq H \leq 10\lambda_{max}$$

where, $\lambda_{min}$ a minimum wavelength of a visible spectrum, $\lambda_{max}$ is a maximum wavelength of the visible spectrum, H is the height of the nanostructures.

In an embodiment, a material of the nanostructures is transparent to optical radiation in a target wavelength band.

In an embodiment, the material of the nanostructures includes at least one of silicon oxide, silicon nitride, aluminum oxide, gallium nitride or titanium oxide.

In an embodiment, the nanostructures in any one of the unit cells are different in structural shape.

In an embodiment, the nanostructures in any one of the unit cells are the same in structural shape.

In an embodiment, a space between two adjacent nanostructures is filled with air.

In an embodiment, a space between two adjacent nanostructures is filled with a filler material that is transparent to the optical radiation in the target wavelength band; a refractive index of the filler material is different from that of the nanostructures; and a height of the filler material is greater than or equal to a height of the nanostructures.

In an embodiment, the nanostructures include a solid nanopillar that has a circular cross-section, a solid nanopillar that has a square cross-section, a solid nanopillar that has a star-shaped cross-section, and an annular nanopillar, a hollow nanopillar that has a circular cross-section and a square hollow section, a hollow nanopillar that has a square cross-section and a round hollow section, a hollow nanopillar that has a square cross-section and a square hollow section, a hollow nanopillar that has a star-shaped hollow section, or a topological nanopillar; and the nanostructures in different positions of the metasurface are transparent to the optical radiation with different incident angles and at different wavelengths.

In an embodiment, an extinction coefficient of the nanostructures in the target wavelength band is less than 0.1.

In an embodiment, an extinction coefficient of the nanostructures in visible light is less than 0.1.

In an embodiment, the nanostructures include a stacked structure; the stacked structure includes at least two nanopillars stacked along the height direction of the nanostructures. The at least two nanopillars are different from each other in structural shape.

In an embodiment, the nanostructures include a stepped structure; and an outer diameter of the stepped structure decreases along a vertical direction away from the metasurface, and the vertical direction refers to a direction that is perpendicular to a plane where the metasurface stands.

In an embodiment, the substrate is a glass substrate with a thickness ranging from 0.05 mm to 2 mm.

In an embodiment, a material of the glass substrate is made of quartz glass, crown glass or other types of glass.

In an embodiment, the metasurface and a light-emitting diode array have an identical shape and an equal area.

In an embodiment, the light-emitting diode array is provided with at least one layer of the metasurface on the light-emitting diode array, for example, being provided with a plurality of layers of metasurfaces on the light-emitting diode array.

Technical solutions of the present disclosure have the following beneficial effects.

In the present embodiment, the substrate is transmissive to optical radiation. Nanostructures are provided on the substrate, and are divided into four quadrants by intersecting a first axis and a second axis. A projection of a cross-sectional quadrant pattern of the nanostructures in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures. The first axis and the second axis are perpendicular to each other, and the first axis and the second axis are both perpendicular to a height direction of the nanostructures, whereby the nanostructures are polarization-insensitive and transmit optical radiation with different incident angles. By providing the metasurface with a plurality of unit cells that include nanostructures, the metasurface is polarization-insensitive and is transmissive to optical radiation with different incident angles, thereby improving the light extraction efficiency of the light-emitting diode. Instead of roughening a substrate surface, embossing a glass surface or adopting a microlens array, the use of the nanostructures in the present disclosure reduces the complexity of the fabrication and lowers the cost, which facilitates mass production.

It should be understood that, the foregoing general descriptions and the following detailed descriptions are merely for exemplary and explanatory purposes and are not intended to limit the present disclosure.

DESCRIPTION OF THE EMBODIMENTS

Figure 1A:
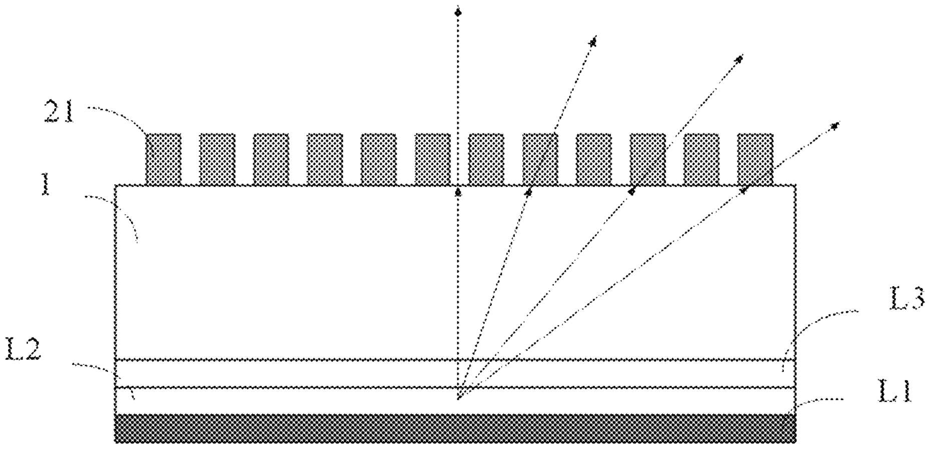
FIG. 1A is a schematic diagram of a metasurface for improving a light extraction efficiency of a light-emitting diode according to an embodiment of the present disclosure (no filler materials provided between nanostructures)

Exemplary embodiments will be described in detail below, and specific examples thereof are shown in the drawings. In the descriptions that refer to the drawings, unless indicated otherwise, a same reference numeral in different drawings represents a same or similar element. Implementations described in the following exemplary embodiments do not exclude other implementations that are consistent with the present disclosure. On the contrary, the implementations mentioned herein are merely partial examples of the claimed devices and the claimed methods and partial aspects of the present disclosure.

Terms used in the present disclosure are only used for describing specific embodiments rather than limiting the present disclosure. The terms "one", "said", and "the" in a singular form used in the specification and the claims are intended to include a plural form unless other meanings are clearly indicated in the context. It should be understood that the term "and/or" as used intends to include any or all possible combinations of one or more associated and listed items.

It should be understood that although terms such as first, second and third may be used to describe various kinds of information of the present disclosure, the information should not be limited by these terms. These terms are only intended to distinguish the same type of information from one another. For example, without departing from the scope of the present disclosure, first information may be referred to as second information, similarly, the second information may be referred to as the first information. Depending on the context, a word "if" as used may be interpreted as "in a case that", "when" or "in response to a determination". In the case without conflict, the limitations and the features of the following embodiments may be combined with each other.

Optical metasurfaces are rapidly emerging and become a mainstream way to realize miniaturization and planarization of optical elements. Metasurface-based conical lenses, blazed gratings, polarizers, holographic dry plates, and planar lenses have emerged in the optical field. Continuous phase coverage from 0 to 2π makes a single-layer aplanatic metalens a reality.

Technical solutions of the present disclosure will be clearly and completely described below with reference to the accompanying drawings and the exemplary embodiments. Based on embodiments of the present disclosure, all other embodiments obtained by those of ordinary skilled in the art without paying any creative efforts fall within the scope of the present disclosure.

Figure 1B:
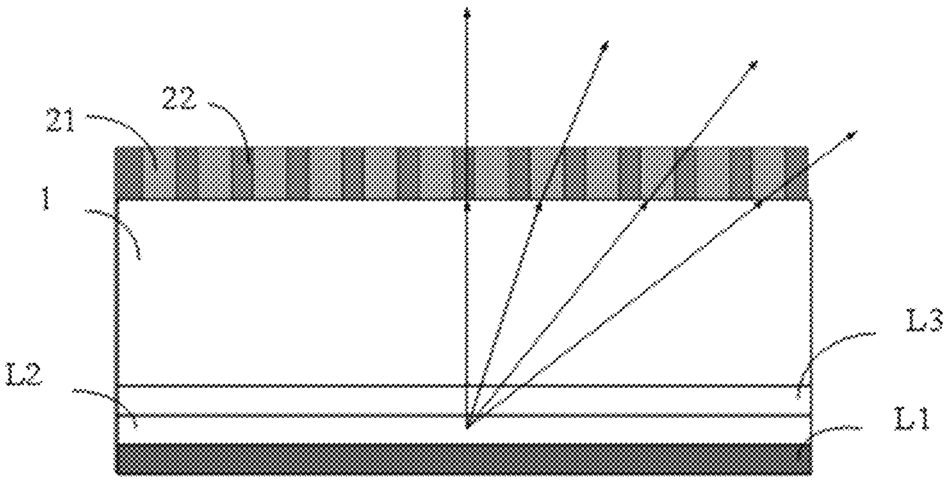
FIG. 1B is a schematic diagram of a metasurface for improving a light extraction efficiency of a light-emitting diode according to an embodiment of the present disclosure (light-transmitting materials are provided to fill a space between nanostructures)

A metasurface for improving a light extraction efficiency of a light-emitting diode is provided according to an embodiment of the present disclosure. Referring to FIG. 1A and FIG. 1B, the metasurface includes a substrate 1 and a plurality of unit cells 2.

Where, the substrate 1 is provided on a metal oxide layer of the light-emitting diode. In an example, the metal oxide layer may be an indium tin oxide (ITO) layer. The substrate 1 is transmissive to optical radiation, for example, the optical radiation is visible light.

The plurality of unit cells 2 are provided on a side of the substrate 1 away from the metal oxide layer. The plurality of unit cells 2 are formed in densely-packed patterns. A center and/or a vertex of each densely-packed pattern are respectively provided with a nanostructure 21.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21.

Preferably, the metasurface for improving the light extraction efficiency of the light-emitting diode according to the present embodiment and a light-emitting diode array have an identical shape and an equal area. The light-emitting diode array is an array of light-emitting diodes. For example, on the metasurface for improving the light extraction efficiency of the light-emitting diode according to the present embodiment, a distance between centers of two adjacent nanostructures 21 is referred to as a period.

Illustratively, the substrate 1 is rigid or flexible. A material of the substrate 1 may be glass, Polymethyl Methacrylate (PMMA) or other transparent materials, such as polyamide (PA). It should be noted that the wording "transparent" recited herein refers to the meaning of being transparent to optical radiation in a target wavelength band, for example, being transparent to the visible spectrum.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21. Respective nanostructures 21 may have a shape of a pillar, or have other shapes that are axially symmetrical along the first axis and the second axis respectively. A specific embodiment will be explained below by taking a pillar-shaped nanostructure as an example. It is understandable that nanostructures 21 may have other shapes in other embodiments, that is, the pillar-shaped nanostructure in the following embodiment may be changed in shape. A space between two adjacent nanostructures 21 is filled with air, as shown in FIG. 1A. It is understandable that the space between the two adjacent nanostructures may be filled with a filler material that is transparent to the optical radiation in the target wavelength band. For example, the filler material may be transparent to the visible spectrum. Optionally, a refractive index of the filler material 22 is different from a refractive index of the nanostructures 21. In an embodiment, a height of the filler material is greater than or equal to a height of the nanostructures 21. Optionally, a material of the nanostructures 21 includes one of silicon oxide, silicon nitride, aluminum oxide, gallium nitride, and titanium oxide.

By accordingly designing nanostructures 21 and unit cells 2 based the type of optical radiation that needs to be transmitted, the metasurface for improving the light extraction efficiency of the light-emitting diode provided in the present disclosure is suitable for occasions where higher transmittance is required for the optical radiation in the target wavelength band, for example, the metasurface of the present disclosure is appropriate for improving the optical radiation transmittance for devices of generating visible light, ultraviolet, infrared, X-ray or other rays. The metasurface provided in the present disclosure may be arranged on a metal oxide layer of a light-emitting diode (LED) or arranged on a metal oxide layer of an organic light-emitting diode (OLED).

An embodiment will be described below by providing a metasurface on an OLED as an example, it is noted that the following example is not intended to limit the present embodiment. The metasurface for improving the light extraction efficiency of the light-emitting diode of the present embodiment is illustrated by FIG. 1A and FIG. 1B. Where, L1 indicates a cathode layer of OLED; L2 indicates an organic layer of OLED; L3 indicates a metal oxide layer (such as an indium tin oxide layer). The filler material 22 in FIG. 1B may be organic glass. It should be understood that the metasurface may include a plurality of nanopillars of different periods and different structures. The OLED may be considered a cosine radiator, and a relationship between light intensity I of the OLED and an emergence angle (an incident angle) θ is described as follows:

$$G(\theta)=\cos(\theta) \tag{1}$$

$$I=I_0 G(\theta) \tag{2}$$

where, I0 is light intensity of light emitted by the OLED towards a vertical direction.

Figure 8:
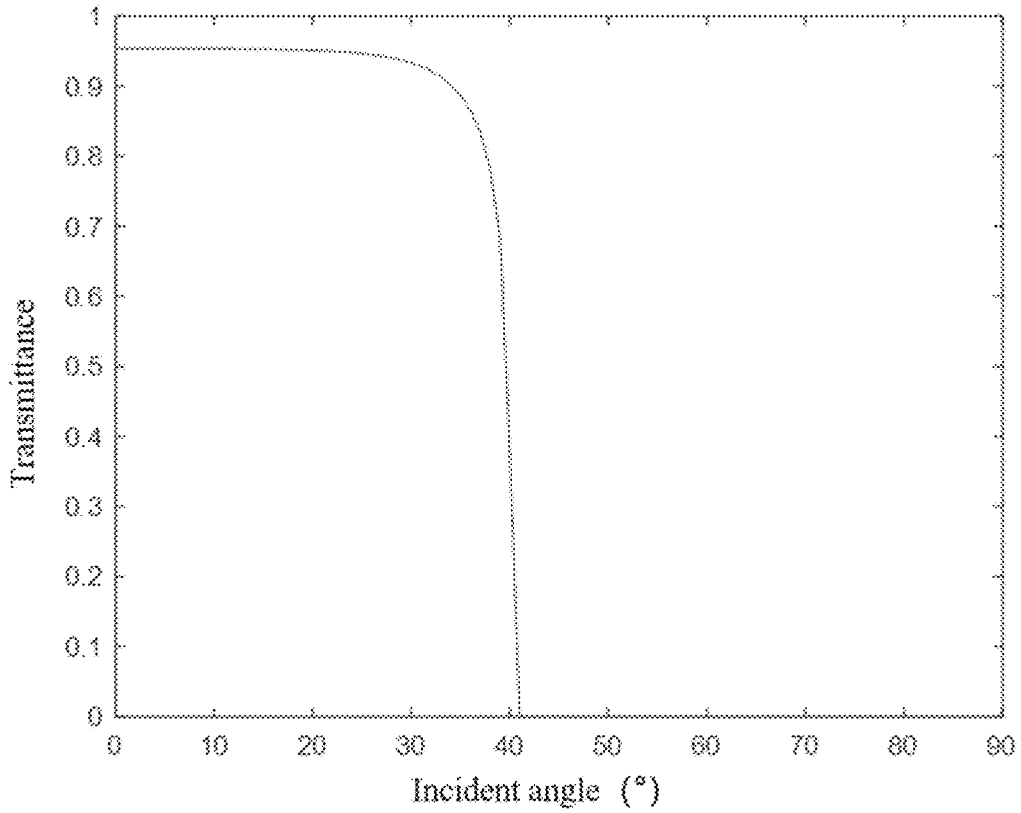
FIG. 8 illustrates transmittance of an OLED without a metasurface for optical radiation with different incident angles according to an embodiment of the present disclosure.
Figure 9:
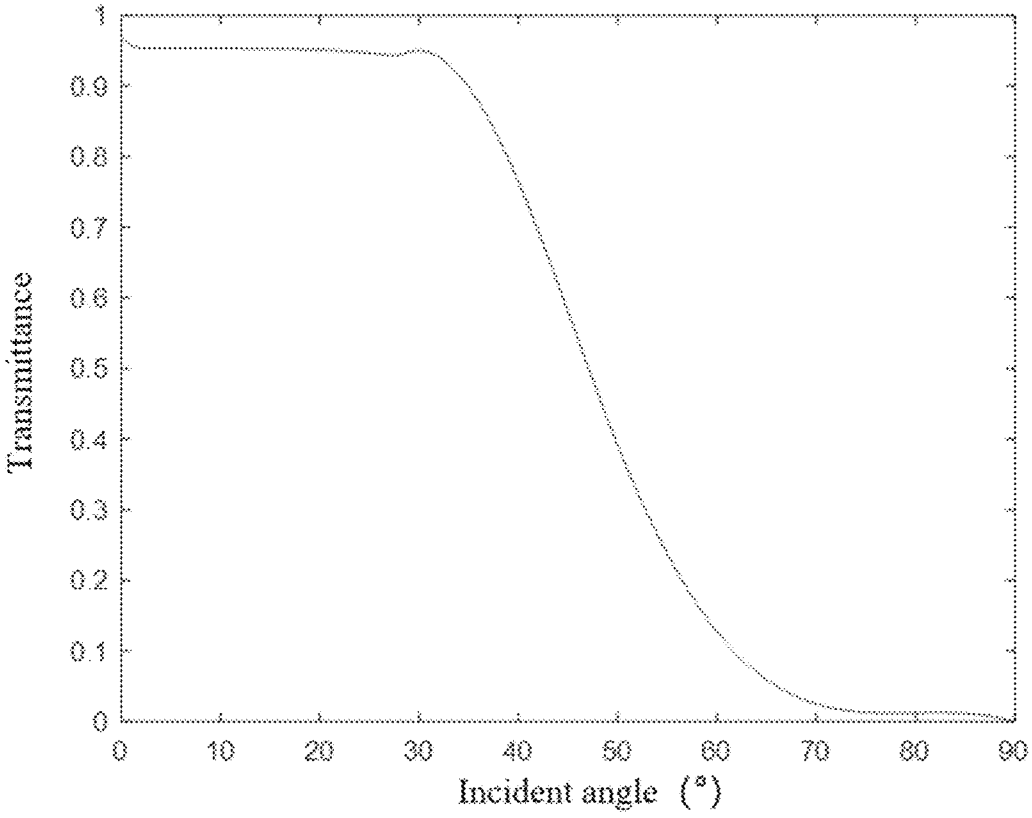
FIG. 9 illustrates transmittance of an OLED provided with a metasurface for optical radiation with different incident angles according to an embodiment of the present disclosure.

The light extraction efficiency of the OLED is described as follows:

$$\eta=\frac{\int_0^{90^\circ} G(\theta)T(\theta)\sin(\theta)d\theta}{\int_0^{90^\circ} G(\theta)\sin(\theta)d\theta} \tag{3}$$

where, G(θ) is a optical radiation intensity function, and T(θ) represents transmittance of a boundary between air and the OLED as a function of incident angles; FIG. 8 depicts T(θ) when a metasurface is absent on the metal oxide layer of OLED; FIG. 9 depicts T(θ) when a metasurface is provided on the metal oxide layer of OLED.

FIGS. 1A and 1B illustrate the principle of the metasurface for improving the light extraction efficiency of the light-emitting diode of the present embodiment. The nanostructures 21 in the present disclosure are configured to allow the optical radiation to escape outwards even when the incident angle of the optical radiation is greater than a critical angle, thereby avoiding the failure of escape of most of photons that is caused by total internal reflection of visible light of different wavelengths and different incident angles. A phase of a nanostructure 21 is related to a height, a cross-sectional shape and a material of the nanostructure 21. Where, cross sections of respective nanostructures 21 are parallel to the substrate 1. It should be noted that the first axis and the second axis pass through the nanostructures 21 from a center thereof, and the first axis and the second axis are parallel to the substrate 1.

Figure 7:
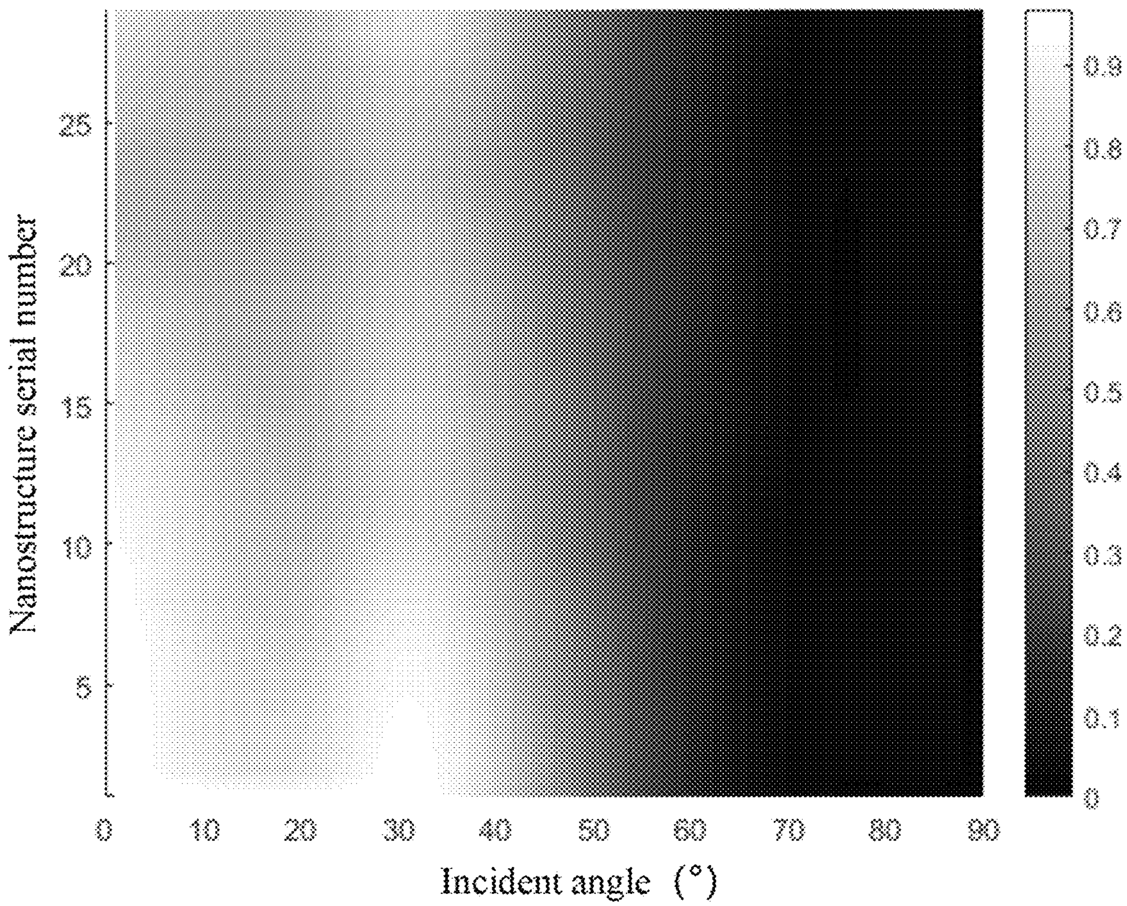
FIG. 7 illustrates average transmittance of different nanostructures in the visible spectrum under different incident angles according to an embodiment of the present disclosure.

FIG. 7 illustrates transmittance of different nanostructures in the visible spectrum under different incident angles according to the present embodiment. Nanostructures with high average transmittance at respective incident angles are selected to generate the metasurface.

Referring to FIGS. 3A to 6B, a height direction of a nanostructure 21 is perpendicular to the substrate 1, and a height H of the nanostructure 21 at least satisfies the following formula:

$$0.5\lambda_{min}\leq H\leq 10\lambda_{max};$$

where, $\lambda_{min}$ is a minimum wavelength of a visible spectrum; $\lambda_{max}$ is a maximum wavelength of the visible spectrum. For example, when an overall structure formed by a plurality of nanostructures 21 needs to transmit visible light, the height H of the nanostructures 21 is greater than or equal to 300 nm and less than or equal to 5000 nm. The minimum size of the nanostructures 21 may be 40 nm, and the wording "size" as recited may refer to a diameter, a side length and/or a minimum distance between two adjacent nanostructures 21. Optionally, the height H of the nanostructures 21 may be 300 nm, 400 nm, 500 nm, 600 nm, 700 nm, 800 nm, 900 nm, 1000 nm, 2000 nm, 3000 nm, 4000 nm or 5000 nm.

In an embodiment, a metasurface for improving a light extraction efficiency of a light-emitting diode is provided. Referring to FIGS. 1A, 1B, 2B and 3A, the metasurface includes a substrate 1 and a plurality of unit cells 2.

Where, a material of the substrate 1 may be glass. The substrate 1 is provided on an indium tin oxide (ITO) layer of a light-emitting diode. The substrate 1 is capable of transmitting visible light.

The plurality of unit cells 2 are provided on a side of the substrate 1 away from the metal oxide layer. Respective unit cells 2 have a shape of a regular hexagon. A center and/or a vertex of the regular hexagon are respectively provided with a nanostructure 21.

Figure 3A:
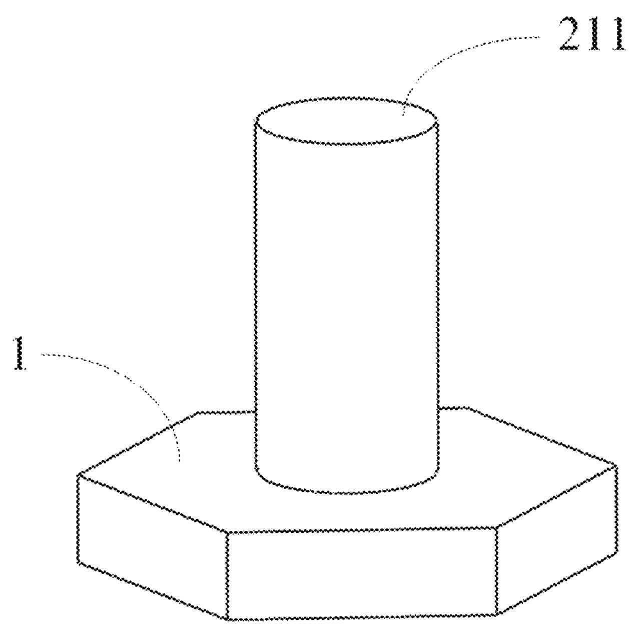
FIG. 3A illustrates an optional structure of a nanopillar that has a circular cross-section according to an embodiment of the present disclosure.

A nanostructure 21 as shown in FIG. 3A is a circular nanopillar 211. The circular nano-column 211 is solid.

Preferably, a period of unit cells 2 ranges from 300 nm to 800 nm. The height H of the circular nanopillar 211 preferably ranges from 300 nm to 5000 nm. A minimum size of the circular nanopillar 211 is preferably 40 nm. The circular nanopillar 211 has a cross section that is perpendicular to a longitudinal axis of the circular nanopillar 211, and a diameter of the cross section of the circular nanopillar 211 is referred to as d. The diameter d of any circular nanopillar 211 is greater than or equal to the minimum size of the circular nanopillar, and is less than or equal to a period of the unit cell 2 where the circular nanopillar 211 is located. For example, when the minimum size of the circular nanopillar 211 is 40 nm and the period of the unit cells 2 is 400 nm, the diameter d ranges from 40 nm to 400 nm, that is, the diameter d may be 40 nm, 50 nm, 150 nm, 200 nm, 230 nm, 300 nm, 350 nm, 400 nm or any other value within the foregoing range.

In an instance, glass has a refractive index of 1.55, and a critical angle for a glass-air boundary is 40.18° above which total internal reflection occurs. Therefore, when the metasurface is absent and an emission angle of the OLED (an incident angle for light incident upon the glass substrate) is greater than 40.18°, the emitted light will be totally reflected to the glass layer. Please refer to FIG. 8 for more details.

In an instance, a plurality of unit cells (where a material of nanostructures is silicon nitride; a period of the nanostructures is 500 nm; the nanostructures are in a regular hexagonal arrangement; a height of the nanostructures is 700 nm; a space between adjacent nanostructures is filled with PMMA) of the present disclosure are provided on a quartz glass substrate, under this condition, referring to FIG. 9, transmittance of the metasurface is not equal to zero when the incident angle is greater than the critical angle of total internal reflection.

Based on the formula (3), the light extraction efficiency of OLED without a metasurface is calculated to be 37.65%; after adding the metasurface on the OLED according to an embodiment, the light extraction efficiency of the OLED is calculated to be 53.2%, displaying an increase of more than 40 percent.

In an embodiment, a metasurface for improving a light extraction efficiency of a light-emitting diode is provided. The metasurface includes a substrate 1 and a plurality of unit cells 2. Where, the substrate 1 is located on a metal oxide layer of the light-emitting diode, for example, being located on an indium tin oxide (ITO) layer. A material of the substrate 1 is quartz glass with a refractive index of 1.55. The plurality of unit cells 2 are provided on a side of the substrate 1 away from the metal oxide layer. Respective unit cells 2 have a shape of a regular hexagon. A center and/or a vertex of the regular hexagon are respectively provided with a nanostructure 21. A period of the regular hexagons is 500 nm.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21.

In the present embodiment, a height of the nanostructures 21 is 700 nm. A material of the nanostructures 21 is silicon nitride, and a space between adjacent nanostructures 21 is filled with PMMA.

Based on the formula (3), the calculated light extraction efficiency of OLED without a metasurface is 37.65%; after adding the metasurface on OLED according to an embodiment, the calculated light extraction efficiency of OLED is 53.2%, displaying an increase of more than 40 percent.

In an optional embodiment, a plurality of unit cells 2 are arranged in an array. Illustratively, the plurality of unit cells 2 are formed in densely-packed patterns, which include, but are not limited to, triangles, squares, regular hexagons and other polygons. Preferably, the shape of the unit cells 2 is hexagonal as shown in FIG. 2B.

Illustratively, a metasurface for improving a light extraction efficiency of a light-emitting diode is provided according to an embodiment. The metasurface includes a substrate 1 and a plurality of unit cells 2.

Where, the substrate 1 is provided on a metal oxide layer of a light-emitting diode, for example, being provided on an indium tin oxide (ITO) layer. The substrate 1 is transmissive to optical radiation, such as visible light.

The plurality of unit cells 2 are arranged on a side of the substrate 1 away from the metal oxide layer. The plurality of unit cells 2 are formed in regular triangles, squares or regular hexagons. A center and/or a vertex of respective foregoing shapes are respectively provided with a nanostructure 21.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21.

Figure 2A:
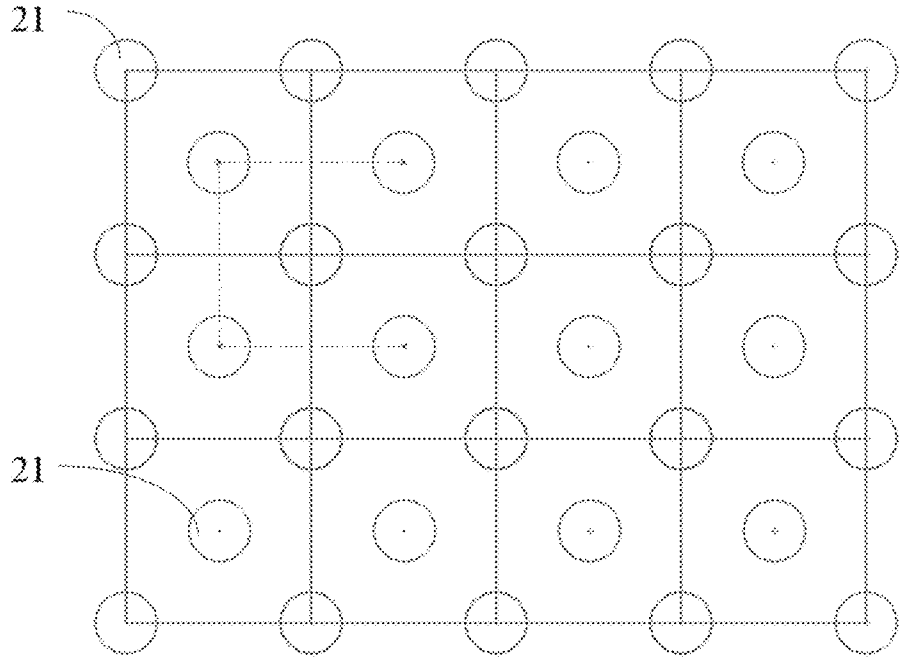
FIG. 2A is a schematic diagram of unit cells in an optional arrangement according to an embodiment of the present disclosure.
Figure 2B:
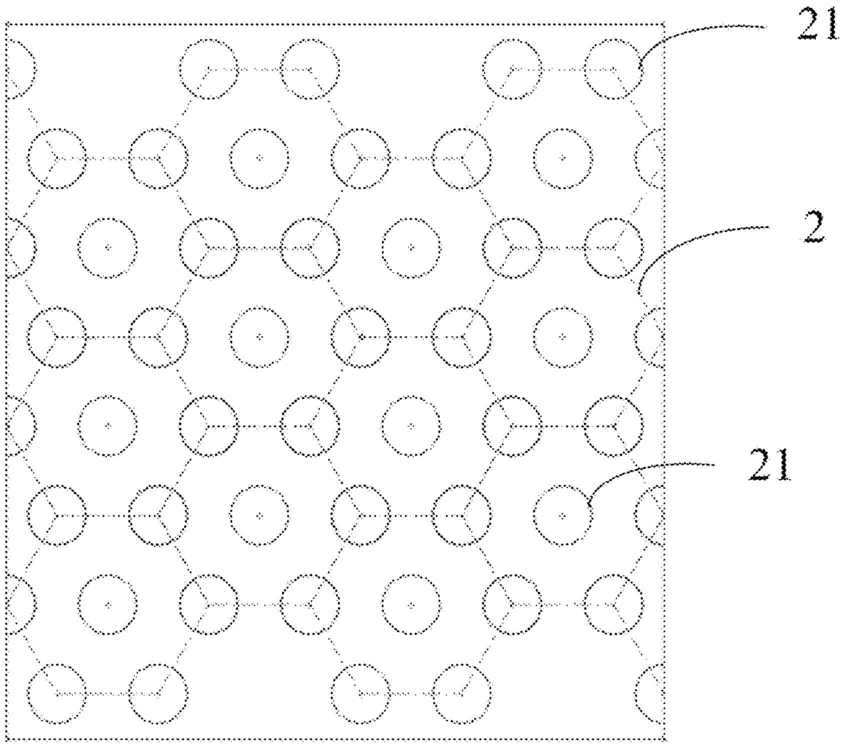
FIG. 2B is a schematic diagram of unit cells in an optional arrangement according to an embodiment of the present disclosure.
Figure 2C:
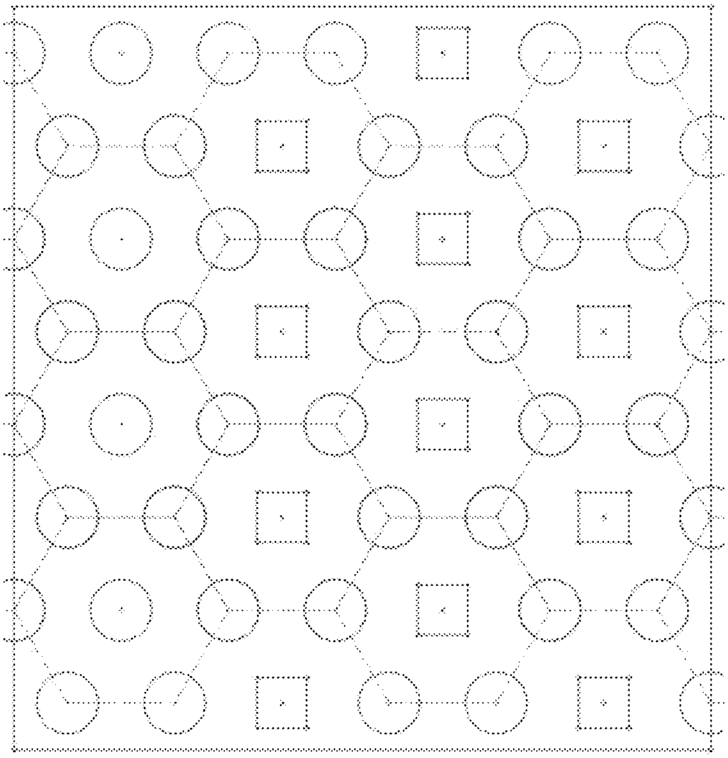
FIG. 2C is a schematic diagram of unit cells in an optional arrangement according to an embodiment of the present disclosure.
Figure 2D:
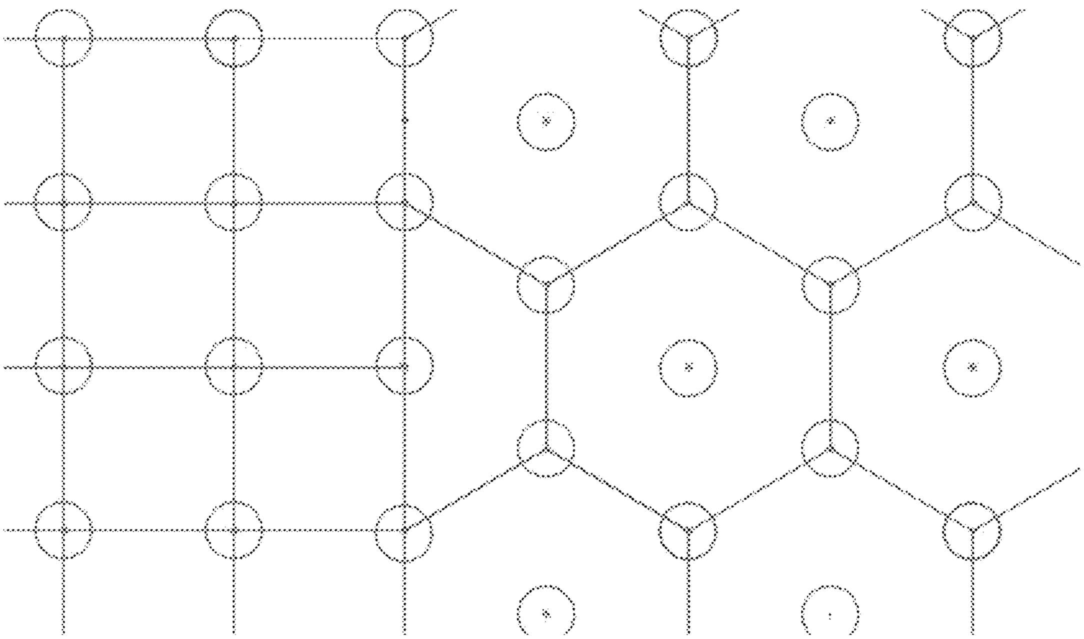
FIG. 2D is a schematic diagram of unit cells in an optional arrangement according to an embodiment of the present disclosure.

In an optional embodiment, as shown in FIG. 2D, a plurality of unit cells 2 are formed in two or more types of densely-packed patterns.

Illustratively, as shown in FIG. 2D, a metasurface for improving a light extraction efficiency of a light-emitting diode is provided according to an embodiment. The metasurface includes a substrate 1 and a plurality of unit cells 2.

Where, the substrate 1 is provided on a metal oxide layer of a light-emitting diode, for example, being provided on an indium tin oxide layer. The substrate 1 is transmissive to optical radiation, such as visible light.

The plurality of unit cells 2 are arranged on a side of the substrate 1 away from the metal oxide layer. The plurality of unit cells 2 are formed in regular triangles, squares or regular hexagons. A center and/or a vertex of respective foregoing shapes are respectively provided with a nanostructure 21.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21.

In an optional embodiment, as shown in FIGS. 2A and 2B, a plurality of unit cells 2 are formed in a type of densely-packed patterns.

Illustratively, as shown in FIG. 2A, a metasurface for improving a light extraction efficiency of a light-emitting diode is provided according to an embodiment. The metasurface includes a substrate 1 and a plurality of unit cells 2.

Where, the substrate 1 is provided on a metal oxide layer of a light-emitting diode, for example, being provided on an indium tin oxide layer. The substrate 1 is transmissive to optical radiation, such as visible light.

The plurality of unit cells 2 are arranged on a side of the substrate 1 away from the metal oxide layer. The plurality of unit cells 2 are formed in squares. A center and/or a vertex of each square are respectively provided with a nanostructure 21.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21.

In an optional embodiment, on a metasurface for improving a light extraction efficiency of a light-emitting diode, a plurality of unit cells 2 are formed in densely-packed patterns. A center and/or a vertex of respective densely-packed patterns are respectively provided with a nanostructure 21. A distance between centers of two adjacent nanostructures 21 is referred to as a period.

For example, the plurality of unit cells 2 are formed in squares, as shown in FIG. 2A. A distance between centers of two adjacent nanostructures 21 is a side length of a square. That is, a period of the unit cells 2 is the side length of the square, as shown in FIG. 2A. For another example, the plurality of unit cells 2 are formed in regular hexagons, as shown in FIG. 2B. A distance between centers of two adjacent nanostructures 21 is a side length of a regular hexagon. That is, a period of the unit cells 2 is the side length of the regular hexagon, as shown in FIG. 2B.

In an optional embodiment, a period of the unit cells ranges from 300 nm to 800 nm. For example, the period of the unit cells may be 300 nm, 400 nm, 500 nm, 600 nm, 700 nm, or 800 nm. In an exemplary embodiment, periods of the unit cells 2 in different positions of the metasurface for improving the light extraction efficiency of the light-emitting diode of the present disclosure are the same. Another exemplary embodiment designs the unit cells 2 in different positions of the metasurface to have different periods. For example, a period of unit cells 2 in a central region of the metasurface for improving the light extraction efficiency of the light-emitting diode of the present disclosure is smaller than a period of unit cells 2 in an edge region of the metasurface. That is, nanostructures 21 in the central region of the metasurface are densely distributed and nanostructures 21 in the edge region of the metasurface are sparsely distributed, thereby ensuring the light extraction efficiency while lowering the production costs.

Illustratively, as show in FIG. 2B, a metasurface for improving the light extraction efficiency of the light-emitting diode is provided according to an embodiment as described below.

Provided is a metasurface for improving a light extraction efficiency of a light-emitting diode. The metasurface includes a substrate 1 and a plurality of unit cells 2.

Where, the substrate 1 is provided on a metal oxide layer of a light-emitting diode, for example, being provided on an indium tin oxide layer. The substrate 1 is transmissive to optical radiation, such as visible light.

The plurality of unit cells 2 are arranged on a side of the substrate 1 away from the metal oxide layer. The plurality of unit cells 2 are formed in regular hexagons of the same size. A center and/or a vertex of respective regular hexagons are respectively provided with a nanostructure 21.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21.

Illustratively, a metasurface for improving the light extraction efficiency of the light-emitting diode is provided according to an embodiment as described below.

Provided is a metasurface for improving a light extraction efficiency of a light-emitting diode. The metasurface includes a substrate 1 and a plurality of unit cells 2.

Where, the substrate 1 is provided on a metal oxide layer of a light-emitting diode, for example, being provided on an indium tin oxide layer. The substrate 1 is transmissive to optical radiation, such as visible light.

The plurality of unit cells 2 are arranged on a side of the substrate 1 away from the metal oxide layer. The plurality of unit cells 2 are formed in regular hexagons with different sizes. For example, a side length of unit cells 2 close to edges of the substrate 1 is greater than a side length of unit cells 2 close to a center of the substrate 1. The regular hexagons are provided with nanostructures 21 which are respectively arranged at a center and/or a vertex of respective regular hexagons.

The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21. The first axis and the second axis are perpendicular to each other, and the first axis and the second axis are both perpendicular to a height direction of the nanostructures 21.

In an optional embodiment, as shown in FIGS. 3A to 4E, nanostructures 21 on a metasurface for improving a light extraction efficiency of a light-emitting diode includes a solid nanopillar 211 that has a circular cross-section, a solid nanopillar 212 that has a square cross-section, a solid nanopillar 213 that has a star-shaped cross-section, and an annular nanopillar 214, a hollow nanopillar 215 that has a circular cross-section and a square hollow section, a hollow nanopillar 216 that has a square cross-section and a round hollow section, a hollow nanopillar 217 that has a square cross-section and a square hollow section, a hollow nanopillar 218 that has a star-shaped hollow section, or a topological nanopillar 219.

For example, nanostructures 21 at different positions are transparent to optical radiation of different wavelengths and different incident angles, for example, being transparent to visible light, that is, an extinction coefficient of the nanostructures 21 in visible light is less than 0.1. Preferably, the extinction coefficient of the nanostructures 21 in the target wavelength band is less than 0.1. Optionally, transmittance of the nanostructures 21 for optical radiation in the target wavelength band is greater than or equal to 80%.

In an embodiment, as shown in FIG. 3A, a metasurface for improving a light extraction efficiency of a light-emitting diode is provided. The metasurface includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a circular nanopillar 211 that is solid.

Figure 3B:
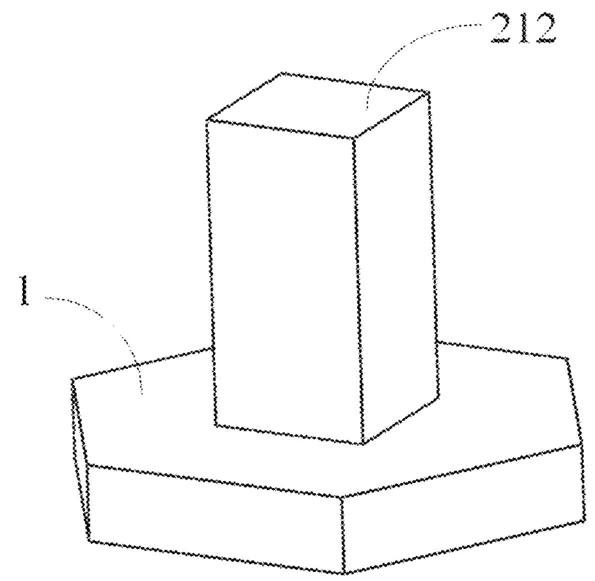
FIG. 3B illustrates an optional structure of a nanopillar that has a square cross-section according to an embodiment of the present disclosure.

Optionally, as shown in FIG. 3B, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a square nanopillar 212 that is solid.

Figure 3C:
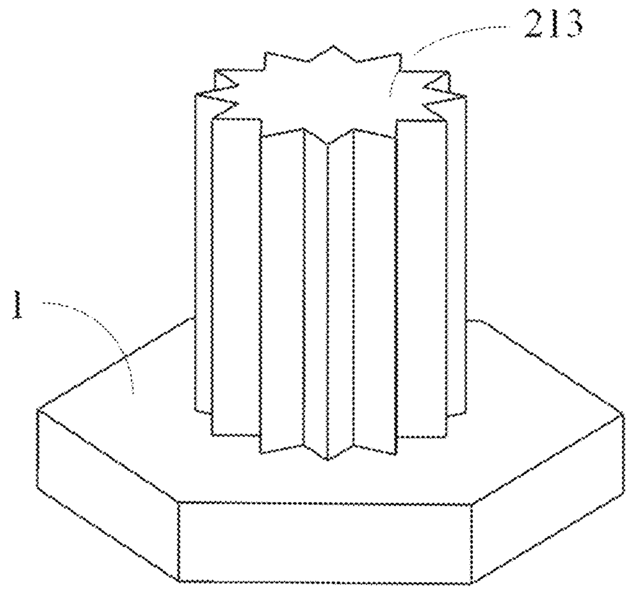
FIG. 3C illustrates an optional structure of a nanopillar that has a star-shaped cross-section according to an embodiment of the present disclosure.
Figure 3D:
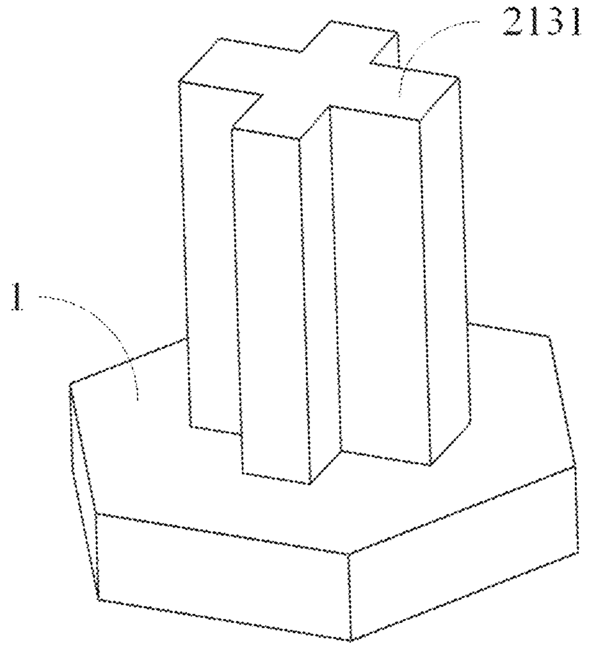
FIG. 3D illustrates another optional structure of a nanopillar that has a star-shaped cross-section according to the embodiment of the present disclosure.

Optionally, as shown in FIG. 3C, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a star-shaped nanopillar 213 that is solid. In an instance, as shown in FIG. 3D, the star-shaped nanopillar 213 may be simplified into a cross-shaped nanopillar 2131.

Figure 3E:
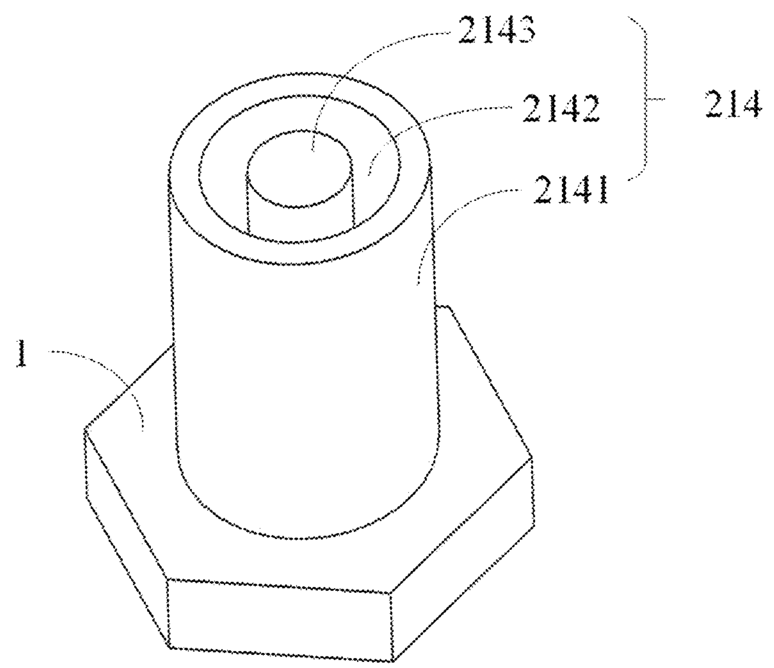
FIG. 3E illustrates an optional structure of an annular nanopillar according to an embodiment of the present disclosure.

Optionally, as shown in FIG. 3E, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include an annular nanopillar 214. The annular nanopillar 214 includes a first cylindrical body 2141, a second cylindrical body 2143 and a first cavity 2142 between the first cylindrical body 2141 and the second cylindrical body 2143. The first cylindrical body 2141 and the first cavity 2142 are conjugated. The second cylindrical body 2143 is sheathed within the first cylindrical body 2141.

Figure 4A:
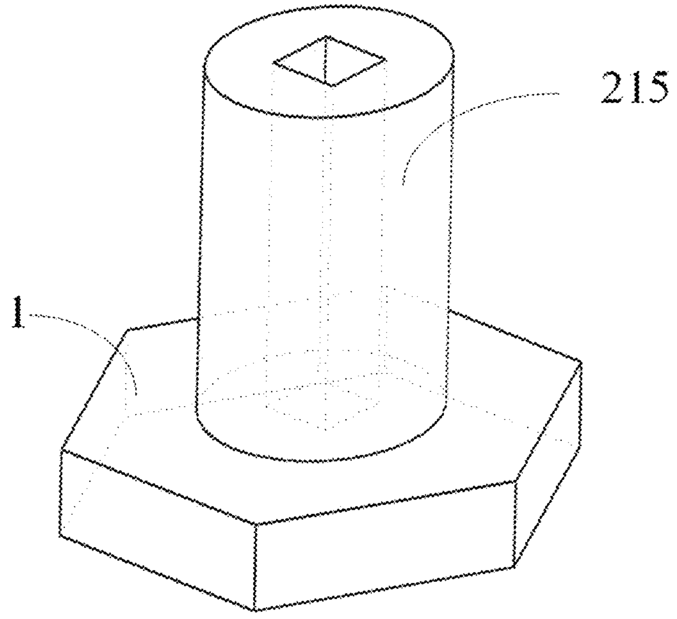
FIG. 4A illustrates an optional structure of a hollow nanopillar that has a circular cross-section and a square hollow section according to an embodiment of the present disclosure.

Optionally, as shown in FIG. 3A, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a hollow nanopillar 215 that has a circular cross-section and a square hollow section. The hollow nanopillar 215 includes a cylindrical body, and a square hollow space is formed within the cylindrical body. In an instance, a depth, a number, and a position of square hollow spaces within respective hollow nanopillars 215 may vary according to different design requirements. For example, a first hollow nanopillar 215 as shown in FIG. 4A includes a cylindrical body and a square hollow space that is formed at a central axis of the cylindrical body of the first hollow nanopillar 215, and a depth of the square hollow space is less than or equal to a height of the cylindrical body of the first hollow nanopillar 215. A second hollow nanopillar 2151 as shown in FIG. 4F includes a cylindrical body and four square hollow spaces, and a depth of each square hollow space is less than or equal to a height of the cylindrical body of the second hollow nanopillar 2151.

Figure 4B:
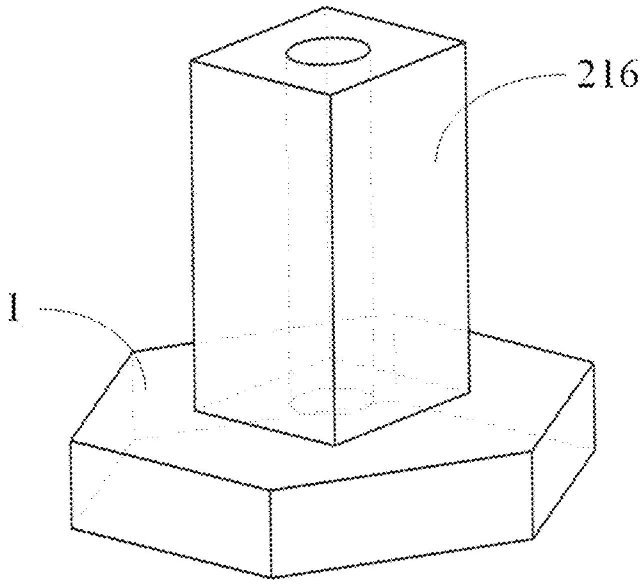
FIG. 4B illustrates an optional structure of a hollow nanopillar that has a square cross-section and a round hollow section according to an embodiment of the present disclosure.

Optionally, as shown in FIG. 4B, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a hollow nanopillar 216 that has a square cross-section and a round hollow section. The hollow nanopillar 216 includes a square pillar body, and a round hollow space is formed within the square pillar body. In an instance, a depth, a number, and a position of round hollow spaces within respective hollow nanopillars 216 may vary according to different design requirements. For example, a first hollow nanopillar 216 as shown in FIG. 4B includes a square pillar body and a round hollow space that is formed at a central axis of the square pillar body of the first hollow nanopillar 216, and a depth of the round hollow space is less than or equal to a height of the square pillar body of the first hollow nanopillar 216. A second hollow nanopillar 2161 as shown in FIG. 4G includes a square pillar body and four round hollow spaces, and a depth of each round hollow space is less than or equal to a height of the square pillar body of the second hollow nanopillar 2161.

Figure 4C:
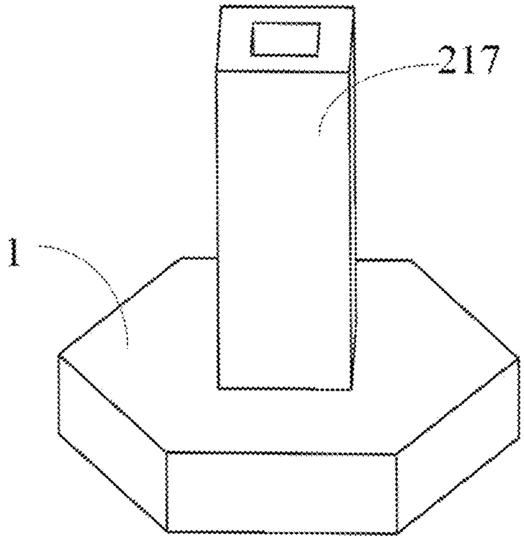
FIG. 4C illustrates an optional structure of a hollow nanopillar that has a square cross-section and a square hollow section according to an embodiment of the present disclosure.

Optionally, as shown in FIG. 4C, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a first hollow nanopillar 217 that has a square cross-section and a square hollow section. The hollow nanopillar 217 includes a square pillar body, and a square hollow space is formed within the square pillar body. In an instance, a depth, a number, and a position of square hollow spaces within respective hollow nanopillars 217 may vary according to different design requirements. For example, the first hollow nanopillar 217 includes a square pillar body and a square hollow space that is formed at a central axis of the square pillar body of the first hollow nanopillar 217, and a depth of the square hollow space is less than or equal to a height of the square pillar body of the first hollow nanopillar 217. A second hollow nanopillar 2171 may include a square pillar body and four square hollow spaces, and a depth of each square hollow space is less than or equal to a height of the square pillar body of the second hollow nanopillar 2171.

Figure 4D:
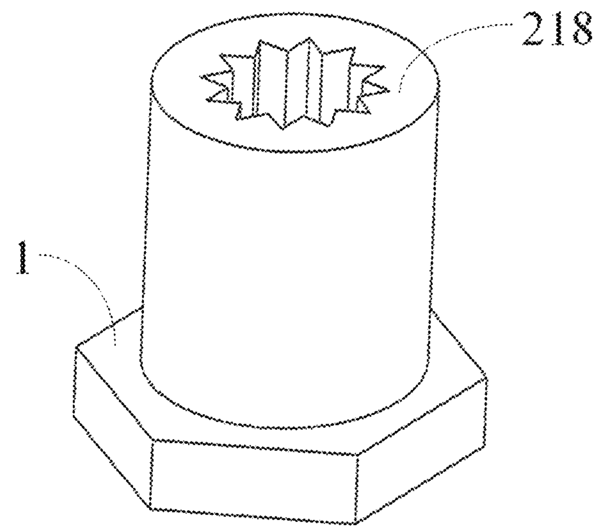
FIG. 4D illustrates an optional structure of a hollow nanopillar with a star-shaped hollow section according to an embodiment of the present disclosure.

Optionally, as shown in FIG. 4D, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a hollow nanopillar 218 that has a star-shaped hollow space. The hollow nanopillar 218 includes a square pillar body or a cylindrical body, and the star-shaped hollow space is formed within the square pillar body or the cylindrical body. In an instance, a depth, a number, and a position of star-shaped hollow spaces within respective hollow nanopillars 218 may vary according to different design requirements. For example, the hollow nanopillars 218 may include a star-shaped hollow space that is formed at a central axis of the cylindrical body of the hollow nanopillar 218, and a depth of the star-shaped hollow space is less than or equal to a height of the cylindrical body of the hollow nanopillar 218. The hollow nanopillars 218 may include four star-shaped hollow spaces, and a depth of each star-shaped hollow space is less than or equal to a height of the square pillar body of the hollow nanopillar 218. In an example, the star-shaped hollow space may be simplified to a cross-shaped hollow space.

Figure 4E:
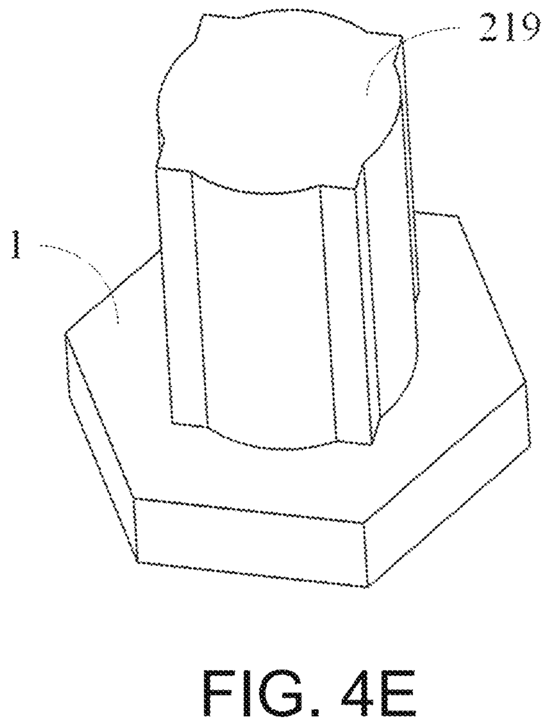
FIG. 4E illustrates an optional structure of a topological nanopillar according to an embodiment of the present disclosure.
Figure 4F:
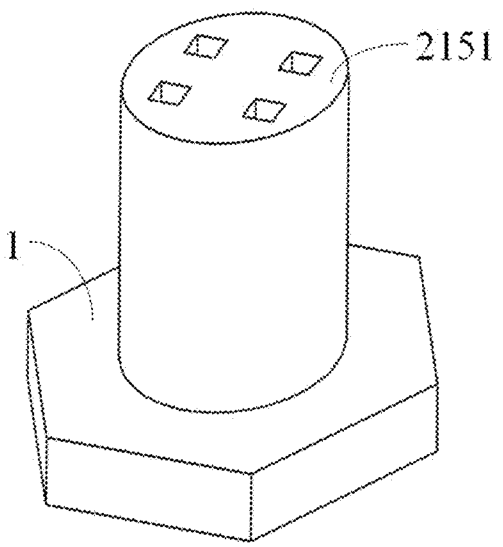
FIG. 4F illustrates another optional structure of a hollow nanopillar that has a circular cross-section and a square hollow section according to an embodiment of the present disclosure.
Figure 4G:
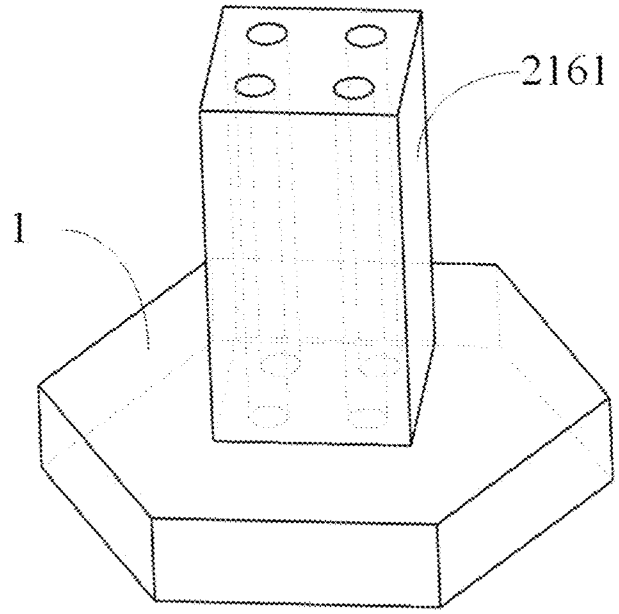
FIG. 4G illustrates another optional structure of a hollow nanopillar that has a square cross-section and a square hollow section according to an embodiment of the present disclosure.

Illustratively, as shown in FIG. 4E, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a topological nanopillar 219 that is solid or hollow.

Figure 5:
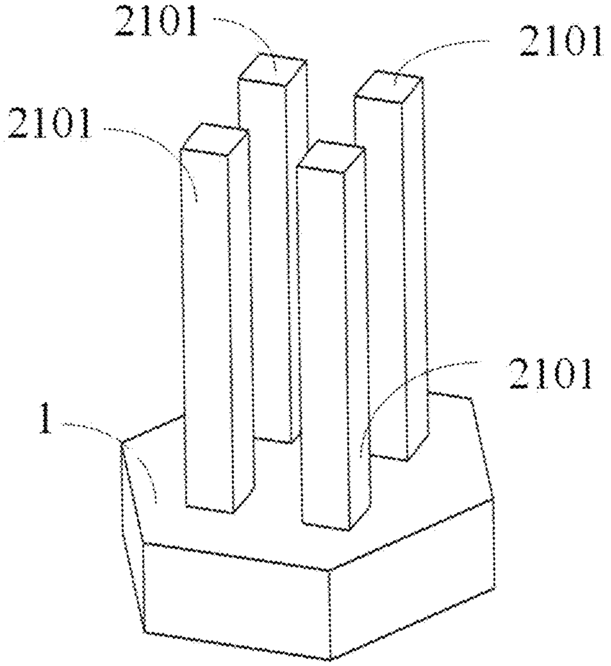
FIG. 5 illustrates an optional structure of a nanostructure according to the embodiment of the present disclosure.

In an optional embodiment, as shown in FIG. 5, the nanostructure 21 of the present embodiment includes at least one nanostructure 2101. Two adjacent nanostructures among the at least one nanostructure 2101 are symmetrically distributed along the first axis and the second axis respectively. The at least one nanostructure 2101 has a shape of a cylinder, a square pillar, a star-shaped pillar, an annular pillar or a topological pillar.

Illustratively, as shown in FIG. 5, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructure 21 includes four nanostructures 2101. Two adjacent nanostructures among the four nanostructures 2101 are symmetrically distributed along the first axis and the second axis respectively. At least one nanostructure 2101 has a shape of a square pillar.

Figure 6A:
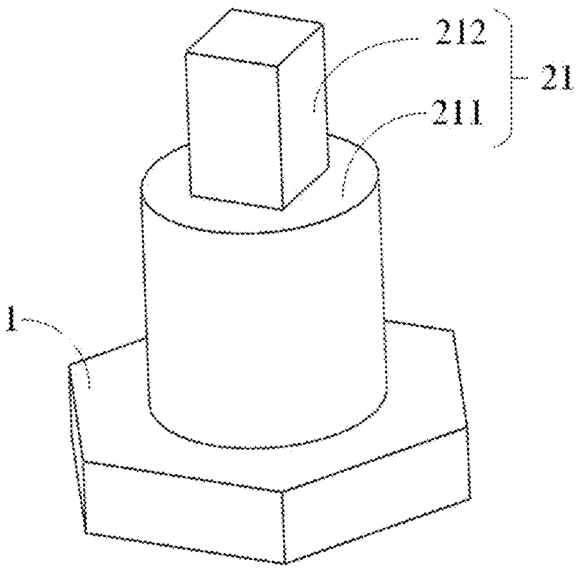
FIG. 6A illustrates an optional structure of a nanostructure according to an embodiment of the present disclosure.

In an optional embodiment, as shown in FIG. 6A, a nanostructure 21 has a stacked structure, which includes at least two nanopillars stacked along a height direction of the nanostructure. The at least two nanopillars are different from each other in structural shape.

Illustratively, as shown in FIG. 6A, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a circular nanopillar 211 and a square nanopillar 212. The square nanopillar 212 and the circular nanopillar 212 are coaxially stacked, and the square nanopillar 212 is located above the circular nanopillar 211.

It should be understood that nanopillars in the stacked structure may include, but are not limited to, a solid nanopillar 211 that has a circular cross-section, a solid nanopillar 212 that has a square cross-section, a solid nanopillar 213 that has a star-shaped cross-section, an annular nanopillar 214, a hollow nanopillar 215 that has a circular cross-section and a square hollow section, a hollow nanopillar 216 that has a square cross-section and a round hollow section, a hollow nanopillar 217 that has a square cross-section and a square hollow section, a hollow nanopillar 218 that has a star-shaped hollow section, and a topological nanopillar 219. It should be noted that a shape, a height, an outer diameter and so forth of each nanopillar in the stacked structure may be the same or different.

Figure 6B:
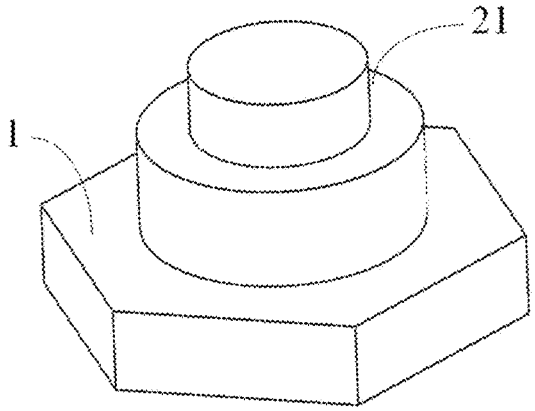
FIG. 6B illustrates an optional structure of a nanostructure according to an embodiment of the present disclosure.

In an optional embodiment, as shown in FIG. 6B, a nanostructure 21 has a stepped structure, and an outer diameter of the stepped structure decreases along a vertical direction away from the metasurface, and the vertical direction refers to a direction that is perpendicular to a plane where the metasurface stands. It should be understood that the outer diameter of the stepped structure may decrease smoothly or stepwise. It should be understood that shapes and heights of nanopillars at different heights of the stepped structure may be the same or different.

Illustratively, as shown in FIG. 6B, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructure 21 has a stepped structure, which includes an upper circular nanopillar and a lower circular nanopillar that are coaxial. A diameter of the upper circular nanopillar is smaller than a diameter of the lower circular nanopillar.

It should be noted that in order to achieve the required optical performance of the design, the metasurface for improving the light extraction efficiency of the light-emitting diode of the present disclosure is configured to allow incident light of different angles and different wavelengths to escape outwards from the metasurface. The nanostructure 21 may have any shape that is formed by combining any cross-sectional shape of a nanopillar of the present disclosure and any cross-sectional shape of a hollow space within a nanopillar of the present disclosure, as long as all nanostructures 21 are shaped to satisfy the following conditions. The nanostructures 21 are divided into four quadrants formed by intersecting a first axis and a second axis. A projection of a cross-sectional quadrant pattern of the nanostructures 21 in any quadrant onto the first axis is the same as a projection of the cross-sectional quadrant pattern onto the second axis. The cross-sectional quadrant pattern in any quadrant is mirrored along the first axis and the second axis to form a cross-sectional pattern of the nanostructures 21.

The first axis and the second axis are perpendicular to each other, and the first axis and the second axis are both perpendicular to a height direction of the nanostructures 21.

In an optional embodiment, as shown in FIG. 2A and FIG. 2B, nanostructures 21 in any one of a plurality of unit cells 2 are the same in structural shape. When nanostructures 21 in the same unit cell 2 are the same in structural shape, phases of all nanostructures 21 of the metasurface are the same. Such identicality of the phases of all nanostructures 21 of the metasurface may cause light that passes through the nanostructures 21 to interact with one another to form interference in the field of view.

In an optional embodiment, as shown in FIG. 2C, nanostructures 21 in the same unit cell 2 are different in structural shape, which disrupts the phase uniformity of the metasurface and thus prevents light that passes through the nanostructures 21 from interacting with one anther to form interference in the field of view. Exemplarily, the nanostructures 21 in the same unit cell 2 include a solid nanopillar 211 that has a circular cross-section, a solid nanopillar 212 that has a square cross-section, a solid nanopillar 213 that has a star-shaped cross-section, an annular nanopillar 214, a hollow nanopillar 215 that has a circular cross-section and a square hollow section, a hollow nanopillar 216 that has a square cross-section and a round hollow section, a hollow nanopillar 217 that has a square cross-section and a square hollow section, a hollow nanopillar 218 that has a star-shaped hollow section, a topological nanopillar 219 or a combination thereof.

Illustratively, a metasurface for improving a light extraction efficiency of a light-emitting diode as provided in an embodiment includes a substrate 1 and a plurality of unit cells 2. Where, the substrate 1 is provided on a metal oxide layer of a light-emitting diode, for example, being provided on an indium tin oxide layer. The substrate 1 is transmissive to optical radiation, such as visible light. The plurality of unit cells 2 are arranged on a side of the substrate 1 away from the metal oxide layer. The plurality of unit cells 2 are formed in densely-packed patterns. A center and/or a vertex of each densely-packed pattern are respectively provided with a nanostructure 21. The nanostructures 21 include a solid nanopillar that has a circular cross-section and a hollow nanopillar 215 that has a circular cross-section and a square hollow section.

Figure 10:
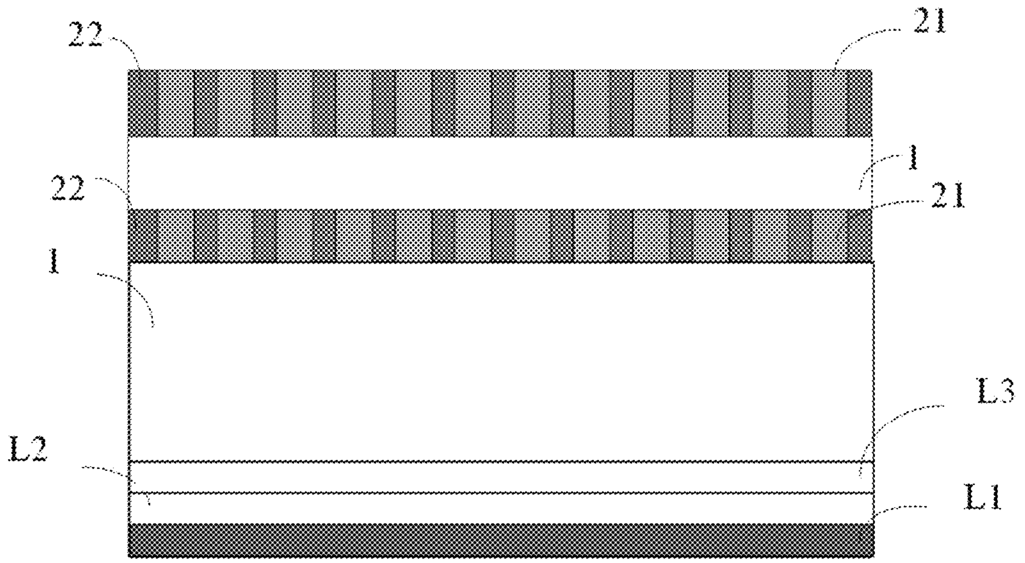
FIG. 10 illustrates an optional structure of a metasurface for improving a light extraction efficiency of a light-emitting diode according to an embodiment of the present disclosure.

For example, as shown in FIG. 10, in order to achieve specific optical performances of a design requirement, a metasurface for improving a light extraction efficiency of a light-emitting diode of an embodiment may include a multi-layered metasurface in which nanostructures are stacked in layers on an array of light-emitting diodes. In other words, the array of light-emitting diodes is provided with at least one layer of the metasurface on the array of light-emitting diodes. For example, as shown in FIG. 10, the array of light-emitting diodes is provided with a metasurface having two layers of nanostructures on the array of light-emitting diodes.

Therefore, nanostructures in the unit cells of the present embodiment allow light to escape outwards even when the incident angle of the light is greater than the critical angle, whereby, the nanostructures are polarization-insensitive and are transmissive to optical radiation with different incident angles. By providing the metasurface with a plurality of unit cells that include nanostructures, the metasurface is polarization-insensitive and is transmissive to optical radiation with different incident angles, thereby improving the light extraction efficiency of the light-emitting diode. In addition, the unit cells are arranged in a densely packed form, which improves the space utilization, thereby improving the light extraction efficiency per unit area. Thus, the arrangement of unit cells that include nanostructures on the metasurface makes the metasurface to transmit optical radiation with different incident angles and renders the metasurface polarization-insensitive, which raises the light extraction efficiency of the light-emitting diode. Instead of roughening a substrate surface, embossing a glass surface or adopting a microlens array, the use of the nanostructures in the present disclosure reduces the complexity of the fabrication and lowers the cost, which facilitates the mass production.

All optional technical solutions as set forth may be combined in an arbitrary way to form other optional technical solutions, which will not be repeated herein.

The embodiments of the present disclosure mentioned above are illustrative, and are not intended to limit the present disclosure. The scope of the embodiments of the present disclosure is not limited thereto. All variations, substitutions or improvements based on the spirits and principles of the present disclosure fall within the scope of the present disclosure.

What is claimed is:

1. A metasurface for improving a light extraction efficiency of a light-emitting diode, comprising:

a substrate and a plurality of unit cells;

wherein the substrate is provided on a metal oxide layer of the light-emitting diode; the substrate is transmissive to optical radiation;

the plurality of unit cells are provided on a side of the substrate away from the metal oxide layer; the plurality of unit cells are formed in densely-packed patterns; the metasurface comprises a plurality of nanostructures, and each of the nanostructures is arranged at a center or a vertex of each densely-packed pattern, or each of the center and the vertex of each densely-packed pattern is provided with one of the nanostructures;

transmittance of the unit cells is not equal to zero for the optical radiation with any incident angle greater than a critical angle; and the nanostructures are divided into four quadrants formed by intersecting a first axis and a second axis; a projection of a cross-sectional quadrant pattern of the nanostructures in any quadrant onto the first axis is the same as a projection of the cross-sectional quadrant pattern onto the second axis; the cross-sectional quadrant pattern in any quadrant is mirrored along the first axis and the second axis to form a cross-sectional pattern of the nanostructures; the first axis and the second axis are perpendicular to each other, and the first axis and the second axis are both perpendicular to a height direction of the nanostructures;

wherein each of the nanostructures has a stacked structure; the stacked structure includes at least two nanopillars stacked along the height direction of the nanostructures, and the at least two nanopillars are different from each other in structural shape.

2. The metasurface according to claim 1, wherein the plurality of unit cells are arranged in an array.

3. The metasurface according to claim 2, wherein a period of any one of the plurality of unit cells is greater than or equal to 300 nm and less than or equal to 800 nm.

4. The metasurface according to claim 3, wherein periods of the unit cells in different positions of the metasurface are the same.

5. The metasurface according to claim 3, wherein periods of the unit cells in different positions of the metasurface are different.

6. The metasurface according to claim 1, wherein the plurality of unit cells comprise at least two types of unit cells in different shapes.

7. The metasurface according to claim 6, wherein any one of the unit cells has a regular hexagon shape and/or a square shape.

8. The metasurface according to claim 7, wherein a height of the nanostructures at least satisfies a formula as follows:

$$0.52\ \mathrm{min} \leq H \leq 10\lambda_{max}$$

wherein, $\lambda_{min}$ is a minimum wavelength of a visible spectrum, $\lambda_{max}$ is a maximum wavelength of the visible spectrum, H is the height of the nanostructures.

9. The metasurface according to claim 8, wherein a material of the nanostructures is transparent to optical radiation in a target wavelength band.

10. The metasurface according to claim 9, wherein the material of the nanostructures comprises at least one of silicon oxide, silicon nitride, aluminum oxide, gallium nitride or titanium oxide.

11. The metasurface according to claim 10, wherein the nanostructures in any one of the unit cells are different in structural shape.

12. The metasurface according to claim 10, wherein the nanostructures in any one of the unit cells are the same in structural shape.

13. The metasurface according to claim 12, wherein a space between two adjacent nanostructures is filled with air.

14. The metasurface according to claim 12, wherein a space between two adjacent nanostructures is filled with a filler material that is transparent to the optical radiation in the target wavelength band; a refractive index of the filler material is different from that of the nanostructures; and a height of the filler material is greater than or equal to a height of the nanostructures.

15. The metasurface according to claim 14, wherein the nanostructures comprise a solid nanopillar that has a circular cross-section, a solid nanopillar that has a square cross-section, a solid nanopillar that has a star-shaped cross-section, and an annular nanopillar, a hollow nanopillar that has a circular cross-section and a square hollow section, a hollow nanopillar that has a square cross-section and a round hollow section, a hollow nanopillar that is square and has a square hollow section, a hollow nanopillar that has a star-shaped hollow section, or a topological nanopillar; and the nanostructures in different positions of the metasurface are transparent to the optical radiation with different incident angles and at different wavelengths.

16. The metasurface according to claim 15, wherein an extinction coefficient of the nanostructures in the target wavelength band is less than 0.1.

17. The metasurface according to claim 1, wherein the nanostructures comprise a stepped structure; and an outer diameter of the stepped structure decreases along a vertical direction away from the metasurface, and the vertical direction refers to a direction that is perpendicular to a plane where the metasurface stands.

18. The metasurface according to claim 17, wherein the metasurface and a light-emitting diode array have an identically shape and an equal area.

19. The metasurface according to claim 18, wherein the light-emitting diode array is provided with at least one layer of the metasurface on the light-emitting diode array.

* * * * *